United States Patent
Sato et al.

(10) Patent No.: US 7,242,323 B2
(45) Date of Patent: Jul. 10, 2007

(54) ELECTRONIC DEVICE HAVING TOUCH SENSOR

(75) Inventors: Kunio Sato, Fukushima-ken (JP);
Yoshihisa Endo, Fukushima-ken (JP);
Masahiro Soma, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 368 days.

(21) Appl. No.: 10/689,491

(22) Filed: Oct. 20, 2003

(65) Prior Publication Data
US 2004/0119342 A1 Jun. 24, 2004

(30) Foreign Application Priority Data
Oct. 22, 2002 (JP) .............................. 2002-306887

(51) Int. Cl.
*H03K 17/94* (2006.01)
(52) U.S. Cl. ............................ 341/33; 341/23; 341/26; 341/32; 341/34; 307/651; 307/652; 345/173; 345/174
(58) Field of Classification Search ................. 341/33, 341/32, 34, 26, 23; 340/870.37; 307/652, 307/115; 348/14.1, 14.03, 14.3; 345/173, 345/174, 172; 446/268
See application file for complete search history.

(56) References Cited
U.S. PATENT DOCUMENTS

| 4,104,595 | A |   | 8/1978  | Overzet                    |
|-----------|---|---|---------|----------------------------|
| 4,145,748 | A | * | 3/1979  | Eichelberger et al. ... 178/18.01 |
| 4,703,573 | A | * | 11/1987 | Montgomery et al. ........ 40/455 |
| 5,465,091 | A | * | 11/1995 | Nishino et al. ............... 341/33 |
| 5,796,389 | A | * | 8/1998  | Bertram et al. ............. 345/173 |
| 6,545,614 | B1|   | 4/2003  | Kasai                      |
| 2003/0067451 | A1 |  | 4/2003 | Tagg et al.              |
| 2004/0043696 | A1 | * | 3/2004 | Suzuki ....................... 446/268 |
| 2004/0178997 | A1 | * | 9/2004 | Gillespie et al. ............ 345/173 |

FOREIGN PATENT DOCUMENTS

| GB | 1 255 631   | 12/1971 |
| JP | 2002-66155  | 3/2002  |

OTHER PUBLICATIONS

Search report dated August 4, 2006 for corresponding European Patent Application No. 03 25 6552.

* cited by examiner

*Primary Examiner*—Jeffery Hofsass
*Assistant Examiner*—Sisay Yacob
(74) *Attorney, Agent, or Firm*—Brinks Hofer Gilson & Lione

(57) ABSTRACT

A variable capacitance unit is formed between one portion of a human body and an opposed electrode facing it through a casing of a robot toy (electronic device) when the one portion of the human body such as a hand or a finger approaches the surface of the casing of the robot. Since the capacitance of the variable capacitance unit varies according to the facing area and the facing distance of the one portion of the human body and the opposed electrode, it is possible to detect the one portion of the human body approaching or touching the robot toy by detecting this change. Since the opposed electrode forming the touch sensor can be provided within the casing, the touch sensor cannot be seen directly from the outside of the robot toy.

36 Claims, 5 Drawing Sheets

ELECTRONIC DEVICE HAVING TOUCH SENSOR

BACKGROUND OF THE INVENTION

1. Field of the Invention

The present invention relates to an electronic device such as a robot toy, PDA, a cellular phone, and a video camera, and especially to an electronic device having a touch sensor that detects the approach or touch with one of a human body such as a hand and a finger.

2. Description of the Related Art

As the conventional technique of the electronic device having this kind of touch sensor, there exists the invention, for example, described in the patent article 1.

The above patent article 1 discloses a robot toy with a cover which can be pushed down provided on the top surface of the head, and having a touch sensor or a tact switch in the bottom portion of this cover.

In the robot toy described in the patent article 1, a push of the cover sets the tact switch ON. Then, a mood counter counts up and down according to the presence of a pressure operation of the head and the manner of the pressure operation to be detected by the tact switch, and the feeling level is set based on the counter value of the mood counter. Feeling and mood of the toy can be expressed with voice, eye, and behavior while controlling the voice output means, feeling expression means, and operation means according to the feeling level.

[Patent Article 1]

Japanese Unexamined Published Patent Application No. 2002-66155

In the robot toy described in the above patent article 1, however, there is an increase in the number of the components forming the robot toy as well as an increase in the cost, because the mechanical tact switch, adopted as a touch sensor, requires a cover for improving its operational ability and hiding itself from the outside.

Since this cover does not exist in the original toy model, it may have a defective design. Further, in order to enrich the feeling expression of the robot toy, it is necessary to increase the number of touch sensors. However, too many tact switches provided in the main body of the robot toy spoil the design in the robot toy.

SUMMARY OF THE INVENTION

The present invention is to solve the above conventional problems, and an object of the invention is to provide an electronic device having a touch sensor, without being exposed to the outside, capable of detecting the state when a human body approaches or touches the casing forming an appearance of the electronic device.

According to the invention, in the electronic device having a touch sensor capable of detecting a human body approaching or touching its casing, the touch sensor comprises an electrode of a predetermined area provided in the inner portion of the casing at a distance from an outer surface of the casing and detecting means for detecting a change of capacitance from the electrode when the human body approaches or touches the outer surface of the casing.

Since the electronic device of the invention can be installed the main body of the touch sensor within the casing forming an appearance of the electronic device, the presence of the touch sensor can be hidden from the outside view. Since no projection or no discolored portion is formed on the surface of the casing of the electronic device, the degree of freedom in the design of the casing surface can be enhanced and the operational ability can be also enhanced. Accordingly, a robot toy, for example, in imitation of an animal can reproduce the original animal itself, and therefore, an animal-shaped robot toy of high reality can be provided. This, however, is not to prevent from forming any projection or discolored portion on the surface of the casing of the electronic device but whether the projection or discolored portion is provided or not depends on the design of the electronic device.

In the above electronic device, the detecting means includes: clock signal generating means for generating a crock signal; delaying means for giving a delay in the rising edge of the clock signal according to the capacitance detected by the electrode when the human body approaches or touches the outer surface of the casing; means for generating a signal depending on the amount of the delay, with the clock signal not passing through the delaying means defined as a reference; and A/D converting means for A/D converting a signal depending on the amount of the change.

In the above means, the touch sensor can be simply formed with the small number of components. Accordingly, the cost of the electronic device can be decreased.

The detecting means detects a change of a facing area of the electrode and the human body.

The detecting means detects an interval that the human body faces the electrode.

It is provided with a plurality of the electrodes, each including the delaying means and the means for generating a signal depending on the amount of the delay of a signal passing through the corresponding delaying means, with a common clock signal as a reference.

In the above means, even when the inner surface of the casing is complicated, the opposed electrode can be divided in small electrodes and the movement of a hand or a finger can be detected in the same way as in the case where it is not divided into small ones.

The electrodes are arranged along the shape of the outer surface of the casing so as to make each portion of the electrodes at equal distance from the outer surface of the casing.

The electronic device of the invention is particularly useful when the casing forms an appearance of a toy and the outer surface of the casing corresponding to a portion provided with the electrode is defined as a touch portion with the human body.

BRIEF DESCRIPTION OF THE DRAWINGS

FIG. 1 shows the head portion of a doll-shaped robot toy according to a first embodiment of the electronic device having a touch sensor of the invention.

DESCRIPTION OF THE PREFERRED EMBODIMENTS

Figure 1A:
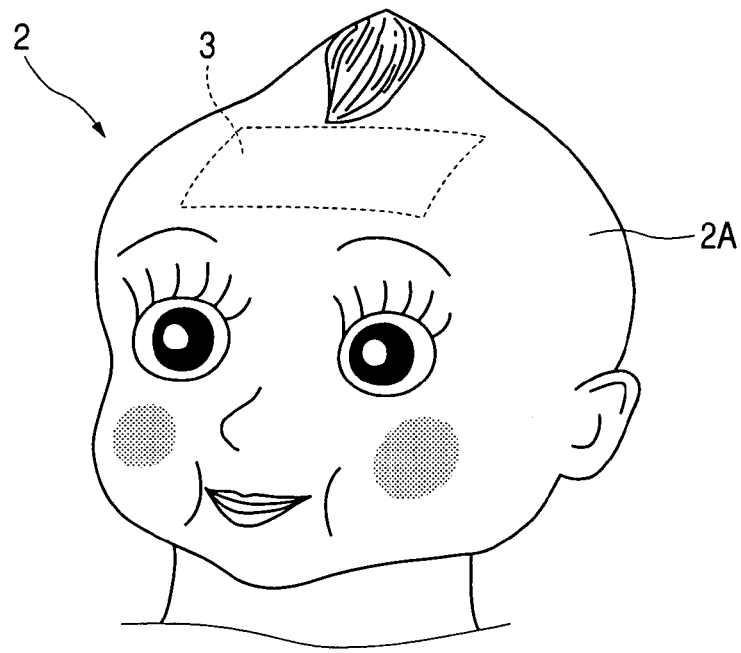
FIG. 1A is a perspective view of the robot toy.
Figure 1B:
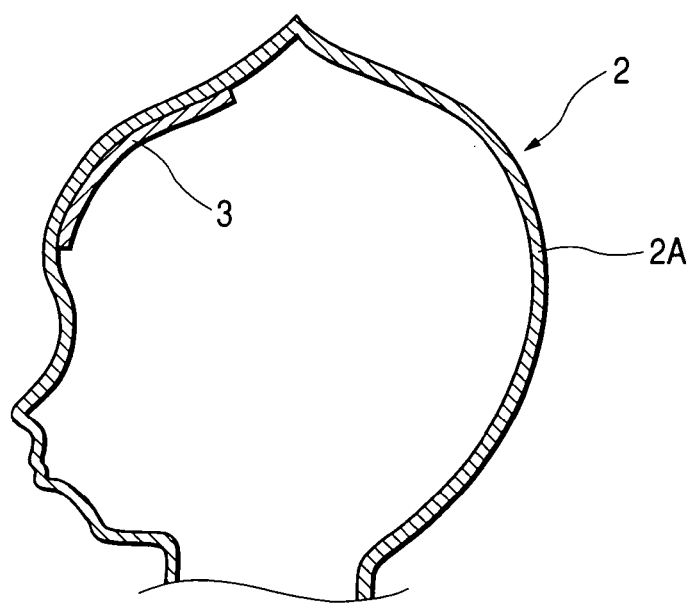
FIG. 1B is a cross sectional view of the robot toy.
Figure 2:
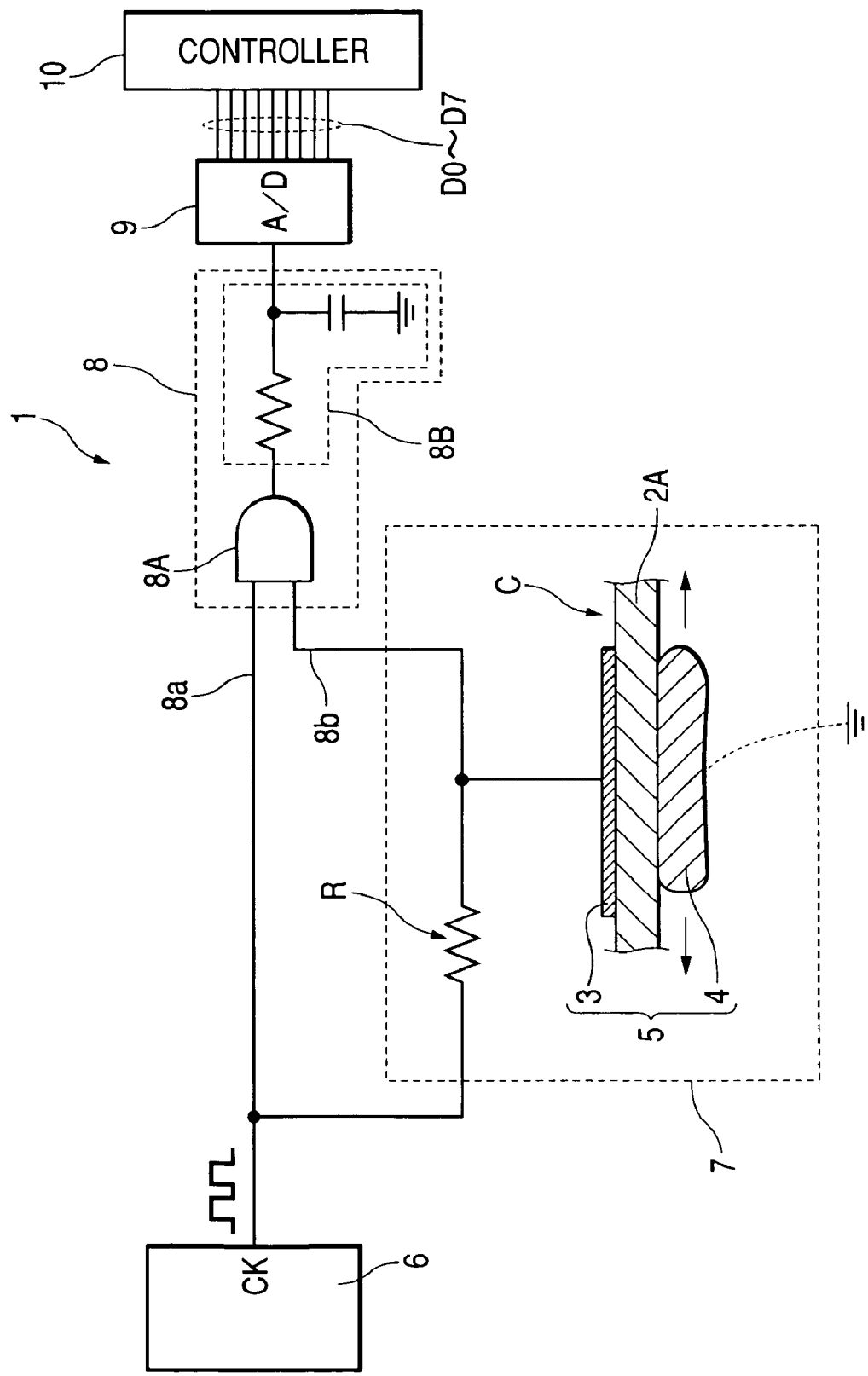
FIG. 2 is a circuit constitutional view showing the concrete structure of the touch sensor.
Figure 3A:
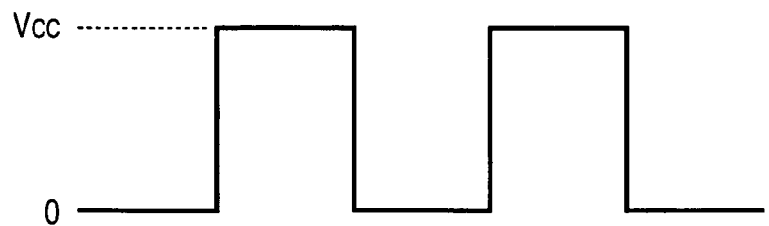
FIG. 3A shows a clock signal entered into one input unit of an AND circuit, 3B shows an output signal entered into the other input unit of the AND circuit from signal delaying means, 3C shows an output signal of the AND circuit (AND), and 3D shows an output signal of smoothing means.
Figure 3B:
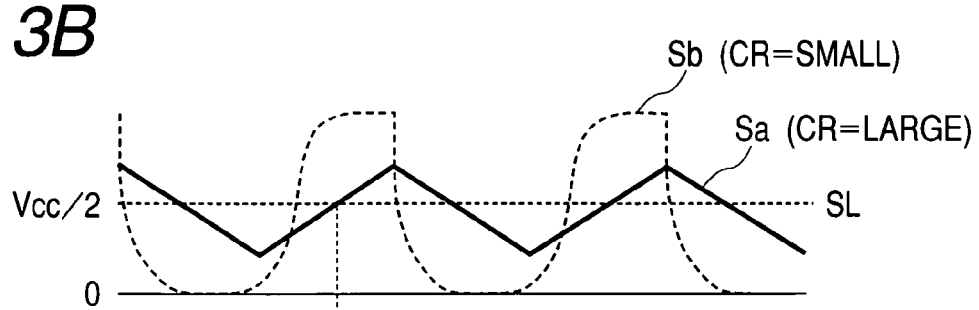
FIG. 3 shows the signals in the respective units of the circuit view of FIG. 2.

FIG. 1 shows a head portion of a doll-shaped robot toy as a first embodiment of the electronic device having a touch sensor according to the present invention; FIG. 1A is a perspective view of the robot toy and FIG. 1B is a cross sectional view of the robot toy. FIG. 2 is a view of a circuit structure showing the concrete structure of the touch sensor. FIG. 3 shows signals in respective units of the circuit of FIG. 2; FIG. 3A shows a clock signal entered into one input unit of the AND circuit, 3B shows an output signal entered into the other input unit of the AND circuit from the signal delaying means, 3C shows an output signal of the AND circuit, and 3D shows an output signal of the smoothing means. The solid line shows the case where the capacitance C is large, and the dotted line shows the case where the capacitance C is small.

As shown in FIG. 1A and FIG. 1B, a robot toy 2 that is one example of the electronic device of the invention is provided with a touch sensor 1 in the head portion. The touch sensor 1 has an opposed electrode 3 of a predetermined area and the opposed electrode 3 is fixed to the inner surface of a casing 2A forming the appearance of the robot toy 2. The opposed electrode 3 is formed by a conductive metal plate such as a copper sheet plate and provided along the inner surface of the casing 2A of the head portion in a little wider area in FIG. 1. It is preferable that the opposed electrode 3 is formed in an extremely thin film and in this case, the opposed electrode 3 can be assuredly fixed to the inner surface of the casing 2A correspondingly to the variously curved shape of the casing 2A.

It is preferable that the casing 2A is made of a material of high dielectric constant $\epsilon$, other than a metal, and for example, made of synthetic resin such as plastic.

The electronic device includes, for example, a human-shaped or an animal-shaped robot toy, PDA (Personal Digital Assistants), a cellular phone, and a video camera. In the first embodiment, the touch sensor I may be installed at any position: at a front of the head, rear of the head, face, back, abdomen, arm, or leg portion of the robot toy. It may be provided at only one position or it may be provided at a plurality of positions.

The opposed electrode 3 is not exposed to the outside of the casing 2A and it cannot be seen from the outside. The opposed electrode 3 may be disposed at the inner portion of the casing 2A with an interval from the outside of the casing 2A, and for example, the opposed electrode may be embedded into the casing 2A so as not to appear on the outer surface. In either way, it is preferable that the opposed electrode 3 is arranged along the curved shape of the outer surface so as to keep each portion within the area at an equal distance from the outer surface of the casing 2A.

The opposed electrode 3 forms one portion of the circuit shown in FIG. 2 and when one portion of a human body 4 such as a hand or a finger approaches or touches the surface of the casing 2A facing the opposed electrode 3, the capacitance C is produced between the human body 4 and the opposed electrode 3. Namely, one portion of the human body 4 such as a hand or a finger works as an electrode producing the capacitance C between the opposed electrode 3 and itself.

The capacitance C varies according to the facing area S or the facing distance d between the opposed electrode 3 and the human body 4, and therefore, the opposed electrode 3 and the human body 4 form a variable capacity unit 5 in this embodiment.

As shown in FIG. 2, the robot toy 2 includes clock signal generating means 6, signal delaying means 7, delay signal detecting means 8, and detecting means for detecting the capacity variation.

The clock signal generating means 6 is to supply regular pulse signals of a predetermined frequency in series. The signal delaying means 7 is formed by the variable capacitance unit 5 and a resistance R connected between the variable capacitance unit 5 and the clock signal generating means 6. The delay signal detecting means 8 is formed by the AND circuit 8A and the smoothing means 8B including a resistance and a condenser provided in the posterior to the AND circuit. A clock signal CK (a clock signal not passing through the signal delaying means 7) that is an output of the clock signal generating means 6 and the output passing through the signal delaying means 7 are received by input units 8a and 8b of the AND circuit 8A and the output of the AND circuit 8A is received by the smoothing means 8B.

In the last stage of the detecting means, namely, in the posterior to the smoothing means 8B of the delay signal detecting means 8, A/D converting means 9 of 8 bits, for example, is connected. The A/D converting means 9 detects the output voltage Vo of the smoothing means 8B at a predetermined sampling cycle and supplies it as the digital outputs D0 to D7, hence to send them to a controller 10 provided within the robot toy 2.

The controller 10 is mainly formed by a CPU, programmed to do a predetermined reaction operation corresponding to various information received from, for example, a visual sensor (CCD camera), an audio-sensor (microphone), an olfactory sensor (not illustrated), besides the touch sensor 1. As the reaction operation, for example, the eyes of the robot toy 2 are twinkled, a cry or a laugh is raised, or arms or legs are moved, by driving a motor or a solenoid, not illustrated, provided within the robot toy 2.

In the touch sensor 1, the capacitance C of the variable capacitance unit 5 varies when the human body 4 such as a hand or a finger approaches or touches the front head of the robot toy 2.

Here, the capacitance C of the variable capacitance unit 5 can be shown by a general formula of Expression 1.

$$C = \epsilon S/d \ [F] \qquad \text{[Expression 1]}$$

Where, $\epsilon$ is the dielectric constant of the casing, S is a facing area of the opposed electrode and the human body, and d is a facing distance between electrodes. The dielectric constant $\epsilon$ is constant.

In the state where a clock signal CK having a predetermined frequency of the amplitude voltage Vcc as shown in FIG. 3A is supplied to the AND circuit 8A and the signal delaying means 7 from the clock signal generating means 6, when a person approaches or touches the front head portion of the robot toy 2 by the whole hand, for example, with a wider facing area S of the human body 4 and the opposed electrode 3, the facing distance d becomes small and the facing area S becomes large, and accordingly the capacitance C of the variable capacitance unit 5 becomes larger according to the expression 1. Accordingly, since the time constant CR defined by the product of the resistance R and the capacitance C of the signal delaying means 7 becomes larger, the output of the signal delaying means 7 turns to be a triangular wave-shaped signal Sa as shown by the solid line in FIG. 3B. The output of the AND circuit 8A (AND) turns to be a pulse waveform having a pulse width ta as shown by the solid line in FIG. 3c. The threshold SL of the H level and the L level in the AND circuit 8A is defined as Vcc/2.

While, when a person approaches or touches the front head portion of the robot toy 2 by the tip of a finger, for example, so as to make the facing area S small, since both the facing distance d and the facing area S become small, the capacitance C of the variable capacitance unit 5 becomes smaller according to the expression 1 than in the case of the wider facing area S. Accordingly, the time constant CR becomes smaller and the output of the signal delaying means 7 becomes the waveform Sb as shown by the dotted line in FIG. 3B. The output of the AND circuit 8A (AND) turns to be a pulse waveform having the pulse width tb, as shown by the dotted line in FIG. 3C.

The pulse width ta in the case of the small capacitance C and the pulse width tb in the case of the large capacitance C satisfy the relationship ta<tb. As for the output voltage Vo supplied from the smoothing means 8B, the output voltage Vb in the case of the touch with the small facing area S (when the capacitance C is small) is greater than the output voltage Va (Va<Vb) in the case of the touch with the large facing area S (when the capacitance C is large).

The output voltages Va and Vb of the smoothing means 8B are converted into the digital outputs D0 to D7 by the A/D converting means 9 and sent to the controller 10. In the controller 10, by monitoring the digital outputs D0 to D7, it is possible to judge the operation state given to the robot toy 2, that is, the touch with the whole hand or a finger tip. It is also possible to detect the interval of the approach or touch with one portion of the human body, according to the temporal change of the digital outputs D0 to D7.

For example, when the controller 10 judges that the facing area S is small and the touching interval is short, it makes the robot toy 2 perform the reaction operation such as raising a cry, assuming that the front head of the robot toy 2 is hit.

Thus, the controller 10 can detect the operation time performed on the front head, which means that the touch sensor has a switching ON/OFF function. For example, when the output voltage Vo shows a predetermined hour and more, the controller 10 can run the built-in program, judging that a user tries to play with the robot toy 2.

Figure 3C:
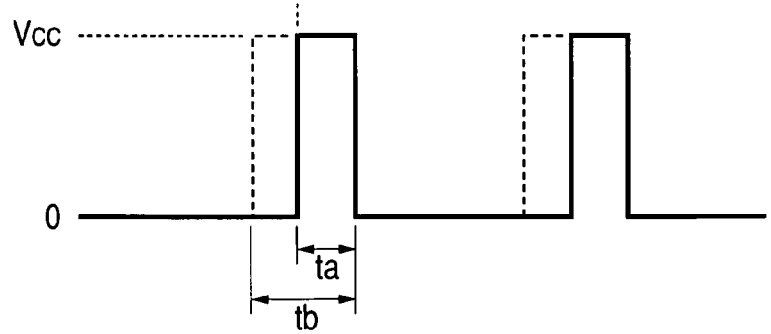
Figure 3D:
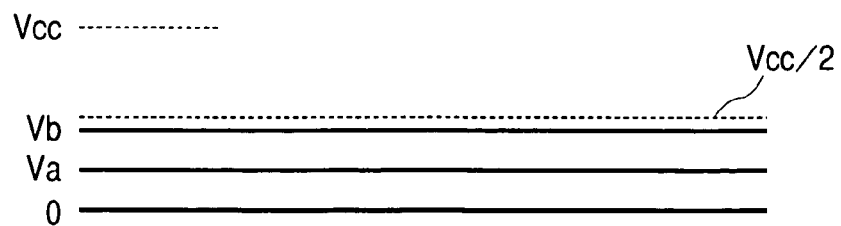

Further, when the human body 4 is moved along the front head in the vertical or horizontal direction, since the facing area S varies, the capacitance C of the variable capacitance unit 5 is increased or decreased. At this time, since the output of the signal delaying means 7 is varied from the triangular wave-shaped signal Sa of the solid line to the waveform Sb of the dotted line in FIG. 3B or from the waveform Sb of the dotted line to the triangular wave-shaped signal Sa of the solid line, the pulse width of the pulse waveform shown in FIG. 3C is also increased or decreased. Accordingly since the output voltage Vo of the smoothing means 8B is varied in the increasing or decreasing direction, the controller 10 can detect the movement of the human body 4, by detecting the temporal change of the digital outputs D0 to D7 of the A/D converting means 9. In this case, the controller 10 can make the robot toy 2 perform the reaction operation such as raising a laugh, judging that the operation of stroking the head has been performed.

In the first embodiment, although the opposed electrode 3 is arranged in almost the whole area of the front head of the robot toy 2 that is the electronic device, the opposed electrode cannot be always arranged in this wide area. Depending on the shape of the electronic device, such a case may be assumed that it is difficult to arrange the opposed electrode 3 directly in the wide area because the inner surface of the casing 2A is too complicated to install the opposed electrode directly there or because the space is restricted owing to the necessity of installing the other unit on the surface of the electronic device. In this case, since the facing area S is decreased, the time constant CR becomes smaller and a desired waveform cannot be obtained, thereby deteriorating the detective accuracy of the touch sensor 1. Therefore, a touch sensor capable of coping with this case will be described as a second embodiment.

Figure 4:
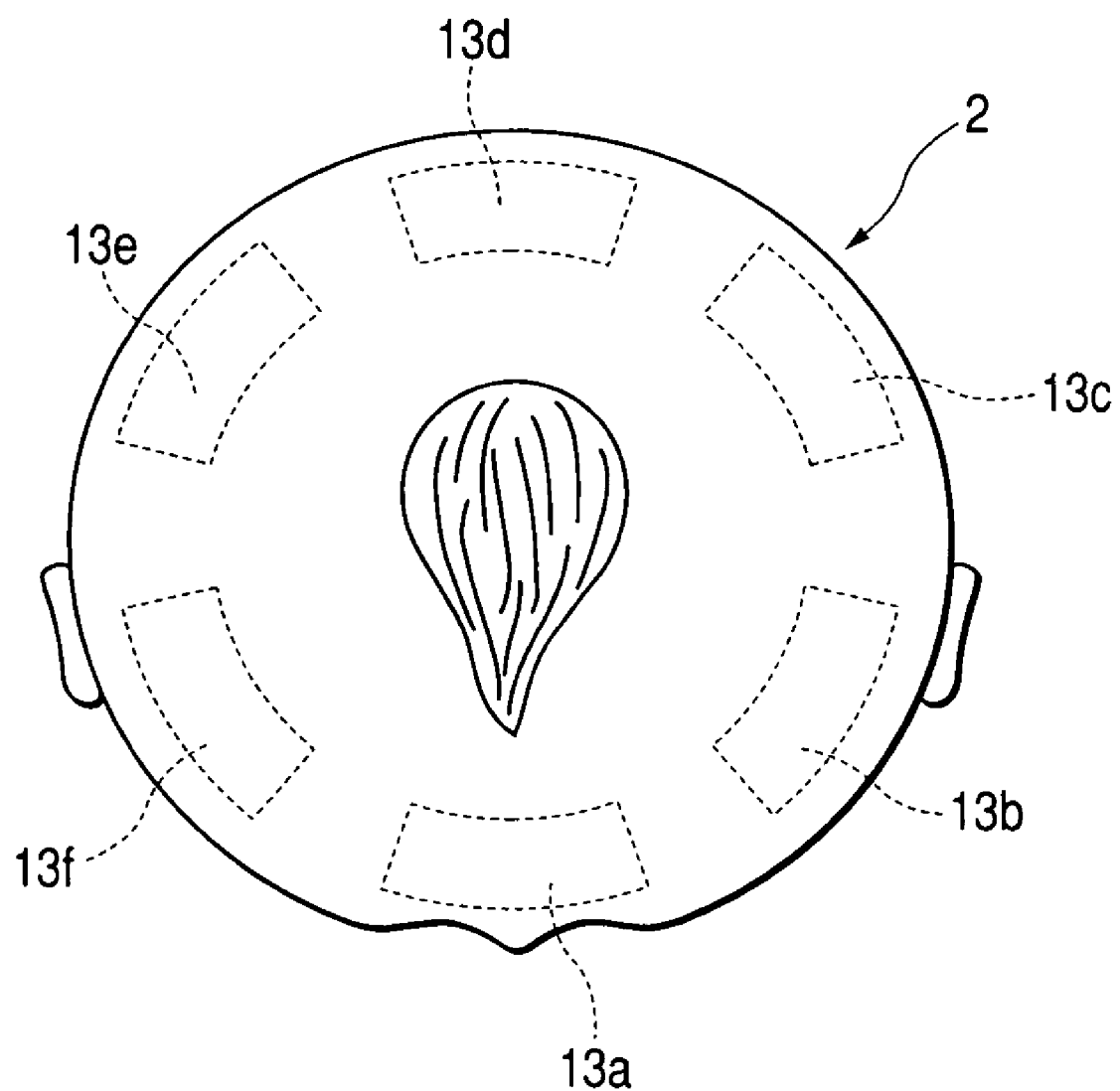
FIG. 4 is a plane view showing the head portion of the robot toy according to a second embodiment of a touch sensor.
Figure 5:
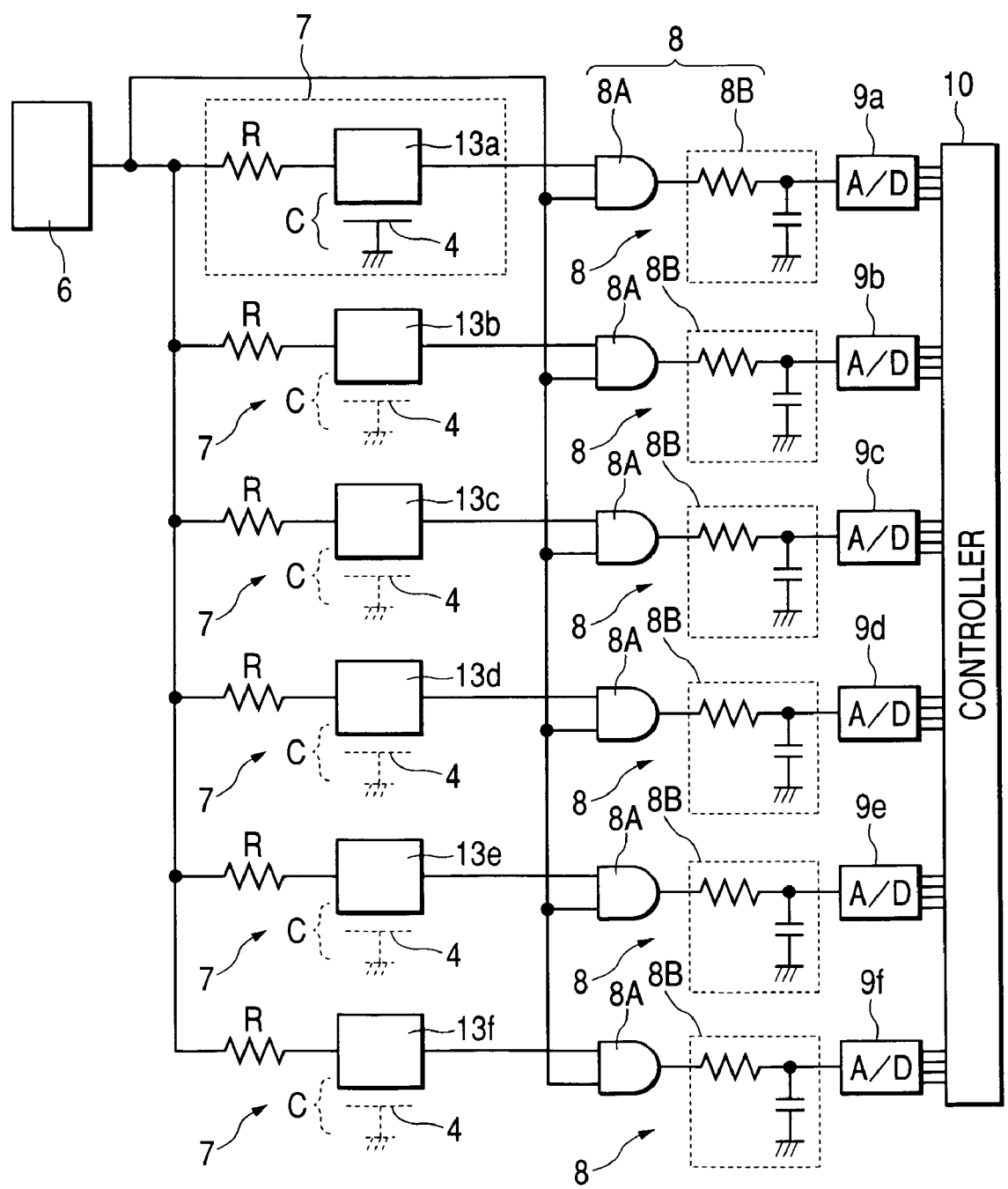
FIG. 5 is a circuit constitutional view in the case of providing with a plurality of touch sensors.

FIG. 4 is a plane view showing the head portion of a robot toy according to the second embodiment of a touch sensor, and FIG. 5 is a circuit constitutional view in the case of providing with a plurality of touch sensors.

As shown in FIG. 4, in the inner surface of the head portion of the robot toy 2, a plurality of opposed electrodes 13 (each opposed electrode is individually shown as 13a, 13b, 13c, 13d, 13e, and 13f) are aligned on the same circumference with constant pitches. The total sum of the areas of the opposed electrodes 13a, 13b, 13c, 13d, 13e, and 13f is set equal to the area of the opposed electrode 3 of the first embodiment or the more. When the opposed electrode 13 is divided into small portions, the individual areas of the opposed electrodes can be decreased. Therefore, even if the inner surface of the casing 2A is more or less complicated or even if the space on the surface of the electric device is restricted, the respective opposed electrodes 13a to 13f can be arranged there.

The opposed electrodes 13a, 13b, 13c, 13d, 13e, and 13f form one portion of the circuit shown in FIG. 5. The circuit shown in FIG. 5 is formed by aligning a plurality of the circuits shown in FIG. 2. Namely, the delay signal detecting means 8 (AND circuit 8A and smoothing means 8B) and the A/D converting means 9 (each A/D converting means is shown as 9a, 9b, 9c, 9d, 9e, and 9f) are provided in each of the opposed electrodes 13a to 13f. However, the clock signal generating means 6 is only one.

In the touch sensor shown in the robot toy according to the second embodiment, when the human body 4 approaches or touches one of the opposed electrodes 13a to 13f, the digital outputs D0 to D7 as mentioned above are respectively supplied from the A/D converting means 9a to 9f corresponding to the above electrode.

Accordingly, it is possible to detect the amount of the area of the human body 4 facing the robot, of the total areas of the opposed electrodes 13a to 13f, by adding the digital outputs D0 to D7 respectively supplied from the A/D converting means 9a to 9f. In the case of shifting the human body 4 such as a hand or a finger in the vertical or horizontal direction while facing it with the head portion, it is possible to change the facing area S of the opposed electrode of 13a to 13f with time according to the movement of the human body 4. The controller 10 can assume the situation of the operation performed by the human body 4 on the head portion of the robot toy 2, by analyzing the situation of a change in the digital outputs D0 to D7 of the respective A/D converting means 9a to 9f.

For example, when the human body 4 such as a hand or a finger touching the head portion of the robot toy 2 is moved in the counterclockwise direction like the opposed electrodes 13a→13b→13c→13d→13e→13f→13a and so on, along the circumference having the opposed electrodes 13, or contrary, in the clockwise direction, it is possible to change the capacitance C of each variable capacitance unit 5 of each signal delaying means 7 in the order according to the rotation direction.

Accordingly, the controller 10 can detect a change in each capacitance C, by sequentially detecting the respective digital outputs D0 to D7 of the respective A/D converting means 9a to 9f, and it can judge that the head portion of the robot toy 2 has been operated. Further, it is also possible to detect whether it has been operated in the clockwise direction or in the counterclockwise direction, according to the order of the varying capacitances C.

As mentioned above, the same function as that of the first embodiment can be achieved, by arranging the opposed electrodes of small area in the inner surface of the casing.

The above can be constituted in that any obstacle such as projection does not appear in the head portion of the robot toy 2. Accordingly, the movement of the human body 4 in the clockwise direction or in the counterclockwise direction is never disturbed by the obstacle, thereby improving the operational ability.

In the above-mentioned second embodiment, although the description has been made in the case of arranging a plurality of opposed electrodes 13 on the same circumference, the invention is not restricted to this, but various arrangements such that they are disposed on a straight line at predetermined intervals or disposed along the S-shaped curve are possible. Therefore, the opposed electrodes of the touch sensor can be arranged, for example, in the back portion, the abdominal portion, the arm portion, or the leg portion of the robot toy 2.

Further, it is also possible to provide the touch sensor 1 in the electronic device, such as PDA, a cellular phone, and a video camera, other than the robot toy. In this case, the scroll operation and the menu operation on a display screen can be made according to the output of the touch sensor, in the PDA or the cellular phone, and the zoom operation of a camera can be made in the video camera.

According to the invention as mentioned above, it is possible to hide the presence of the touch sensor provided within the electronic device from outside view. Accordingly, the sense of design can be improved about the surface of the casing forming an appearance of the electronic device.

Since the touch sensor can be simply formed by the small number of the components, the cost of the whole electronic device can be decreased.

Since the opposed electrode is divided into small units and they can be arranged in the inner surface of the casing, even when its shape is complicated or even when the space on the surface of the electronic device is restricted, it is possible to set the opposed electrodes there correspondingly.

What is claimed is:

1. An electronic device comprising a casing and a touch sensor capable of detecting a human body approaching or touching the casing, wherein
   the touch sensor comprises an electrode of a predetermined area provided in an inner portion of the casing at a distance from an outer surface of the casing and detecting means for detecting a change of capacitance from the electrode when the human body approaches or touches the outer surface of the casing,
   the electrode is divided into a plurality of electrode elements, wherein each electrode element being connected to the detecting means,
   the electrode elements are operative to output on the basis of a change in a facing area relative to the total area of the electrode elements or a rate of change in the position of the facing area with time,
   wherein the facing area changes as the human body approaches or touches the outer surface of the casing, and
   a plurality of states of operation performed by an operator detected using outputs from the electrode elements.

2. The electronic device according to claim 1, wherein the detecting means includes:
   clock signal generating means for generating a clock signal;
   delaying means for giving a delay in rising up the clock signal according to the capacitance detected by the electrode when the human body approaches or touches the outer surface of the casing,
   means for generating a signal depending on the amount of the delay, with the clock signal not passing through the delaying means defined as a reference; and
   A/D converting means for A/D converting a signal depending on the amount of the change from analog to digital.

3. The electronic device according to claim 2, wherein the detecting means detects a change of a facing area of the electrode and the human body.

4. The electronic device according to claim 2, wherein the detecting means detects an interval that the human body faces the electrode.

5. The electronic device according to one of claims 2, wherein
   a plurality of the electrodes are provided, each electrode including the delaying means and the means for generating a signal depending on the amount of the delay of a signal passing through the corresponding delaying means, with a common clock signal as a reference.

6. The electronic device according to one of claims 1, wherein
   the electrodes are arranged along a shape of the outer surface so as to make each portion of the electrodes at equal distance from the outer surface of the casing.

7. The electronic device according to one of claims 1, wherein
   the casing forms an appearance of a toy and the outer surface of the casing corresponding to a portion provided with the electrode is defined as a touch portion with the human body.

8. The electronic device according to claim 3, wherein the detecting means detects an interval that the human body faces the electrode.

9. The electronic device according to one of claims 3, wherein
   a plurality of the electrodes are provided, each electrode including the delaying means and the means for generating a signal depending on the amount of the delay of a signal passing through the corresponding delaying means, with a common clock signal as a reference.

10. The electronic device according to one of claims 4, wherein
    a plurality of the electrodes are provided, each electrode including the delaying means and the means for generating a signal depending on the amount of the delay of a signal passing through the corresponding delaying means, with a common clock signal as a reference.

11. The electronic device according to one of claims 8, wherein
    a plurality of the electrodes are provided, each electrode including the delaying means and the means for generating a signal depending on the amount of the delay of a signal passing through the corresponding delaying means, with a common clock signal as a reference.

12. The electronic device according to one of claims 2, the electrodes are arranged along a shape of the outer surface so as to make each portion of the electrodes at equal distance from the outer surface of the casing.

13. The electronic device according to one of claims 3, the electrodes are arranged along a shape of the outer surface so as to make each portion of the electrodes at equal distance from the outer surface of the casing.

14. The electronic device according to one of claims 4, the electrodes are arranged along a shape of the outer surface so as to make each portion of the electrodes at equal distance from the outer surface of the casing.

15. The electronic device according to one of claims 5, the electrodes are arranged along a shape of the outer surface so as to make each portion of the electrodes at equal distance from the outer surface of the casing.

16. The electronic device according to one of claims 8, the electrodes are arranged along a shape of the outer surface so as to make each portion of the electrodes at equal distance from the outer surface of the casing.

17. The electronic device according to one of claims 9, wherein
the electrodes are arranged along a shape of the outer surface so as to make each portion of the electrodes at equal distance from the outer surface of the casing.

18. The electronic device according to one of claims 10, wherein
the electrodes are arranged along a shape of the outer surface so as to make each portion of the electrodes at equal distance from the outer surface of the casing.

19. The electronic device according to one of claims 11, wherein
the electrodes are arranged along a shape of the outer surface so as to make each portion of the electrodes at equal distance from the outer surface of the casing.

20. The electronic device according to one of claims 2, wherein
the casing forms an appearance of a toy and the outer surface of the casing corresponding to a portion provided with the electrode is defined as a touch portion with the human body.

21. The electronic device according to one of claims 3, wherein
the casing forms an appearance of a toy and the outer surface of the casing corresponding to a portion provided with the electrode is defined as a touch portion with the human body.

22. The electronic device according to one of claims 4, wherein
the casing forms an appearance of a toy and the outer surface of the casing corresponding to a portion provided with the electrode is defined as a touch portion with the human body.

23. The electronic device according to one of claims 5, wherein the casing forms an appearance of a toy and the outer surface of the casing corresponding to a portion provided with the electrode is defined as a touch portion with the human body.

24. The electronic device according to one of claims 6, wherein the casing forms an appearance of a toy and the outer surface of the casing corresponding to a portion provided with the electrode is defined as a touch portion with the human body.

25. The electronic device according to one of claims 8, wherein the casing forms an appearance of a toy and the outer surface of the casing corresponding to a portion provided with the electrode is defined as a touch portion with the human body.

26. The electronic device according to one of claims 9, wherein the casing forms an appearance of a toy and the outer surface of the casing corresponding to a portion provided with the electrode is defined as a touch portion with the human body.

27. The electronic device according to one of claims 10, wherein the casing forms an appearance of a toy and the outer surface of the casing corresponding to a portion provided with the electrode is defined as a touch portion with the human body.

28. The electronic device according to one of claims 11, wherein the casing forms an appearance of a toy and the outer surface of the casing corresponding to a portion provided with the electrode is defined as a touch portion with the human body.

29. The electronic device according to one of claims 12, wherein the casing forms an appearance of a toy and the outer surface of the casing corresponding to a portion provided with the electrode is defined as a touch portion with the human body.

30. The electronic device according to one of claims 13, wherein the casing forms an appearance of a toy and the outer surface of the casing corresponding to a portion provided with the electrode is defined as a touch portion with the human body.

31. The electronic device according to one of claims 14, wherein the casing forms an appearance of a toy and the outer surface of the casing corresponding to a portion provided with the electrode is defined as a touch portion with the human body.

32. The electronic device according to one of claims 15, wherein the casing forms an appearance of a toy and the outer surface of the casing corresponding to a portion provided with the electrode is defined as a touch portion with the human body.

33. The electronic device according to one of claims 16, wherein the casing forms an appearance of a toy and the outer surface of the casing corresponding to a portion provided with the electrode is defined as a touch portion with the human body.

34. The electronic device according to one of claims 17, wherein the casing forms an appearance of a toy and the outer surface of the casing corresponding to a portion provided with the electrode is defined as a touch portion with the human body.

35. The electronic device according to one of claims 18, wherein the casing forms an appearance of a toy and the outer surface of the casing corresponding to a portion provided with the electrode is defined as a touch portion with the human body.

36. The electronic device according to one of claims 19, wherein the casing forms an appearance of a toy and the outer surface of the casing corresponding to a portion provided with the electrode is defined as a touch portion with the human body.

* * * * *